United States Patent [19]
Yamagishi

[11] Patent Number: 5,348,893
[45] Date of Patent: Sep. 20, 1994

[54] METHOD FOR TREATMENT OF SEMICONDUCTOR WAFER

[75] Inventor: Hirotoshi Yamagishi, Gunma, Japan

[73] Assignee: Shin-Etsu Handotai Co., Ltd., Tokyo, Japan

[21] Appl. No.: 31,119

[22] Filed: Mar. 12, 1993

[30] Foreign Application Priority Data

Mar. 17, 1992 [JP] Japan ................................. 4-091771

[51] Int. Cl.$^5$ ............................................ H01L 21/322
[52] U.S. Cl. ................................................... 437/10
[58] Field of Search .............................. 437/10, 11, 24; 148/DIG. 60

[56] References Cited

U.S. PATENT DOCUMENTS

| | | | |
|---|---|---|---|
| 4,820,650 | 4/1989 | Nagae et al. | 437/10 |
| 4,932,168 | 6/1990 | Tada et al. | 437/10 |
| 5,035,750 | 6/1991 | Tada et al. | 437/10 |

OTHER PUBLICATIONS

Ghandhi, VLSI Fabrication Principles, John Wiley & Sons, 1983, pp. 518–520.

Primary Examiner—George Fourson
Assistant Examiner—Savitri Mulpuri
Attorney, Agent, or Firm—Ronald R. Snider

[57] ABSTRACT

A method for the impartation of a mechanical distortion to a semiconductor wafer by the collision of particles against the surface of the semiconductor wafer is disclosed which represses the pollution of the semiconductor wafer with impurities from the particles, permits effective removal of the impurities adhering to the surface of the semiconductor wafer, and allows the density of lattice defects imparted into the semiconductor wafer to be freely varied and controlled as desired. The method which effects the intentional impartation of lattice distortion to the surface of the semiconductor wafer by the collision of particles against the semiconductor wafer comprises molding a substance possessing a melting point of not higher than 30° C. and exhibiting solubility in water into particles of a diameter in the range of from 0.001 to 1 mm and causing the particles to collide against the surface of the semiconductor wafer.

6 Claims, No Drawings

METHOD FOR TREATMENT OF SEMICONDUCTOR WAFER

BACKGROUND OF THE INVENTION

1. Field of the Invention

This invention relates to method for the treatment of a semiconductor wafer and more particularly to a method for the treatment of a semiconductor wafer by the impartation of a mechanical distortion to the surface of the semiconductor wafer, which method represses defilement of the treatment surface of the semiconductor wafer with impurities and permits effective removal of impurities adhering to the treated surface in consequence of the impact employed for the mechanical distortion.

2. Description of the Prior Art

In recent years, the trend of semiconductor devices toward further size reduction and further addition to the scale of integration of components on a chip has come to impose increasingly exacting demands on semiconductor wafers which are destined to form substrates of semiconductor devices. One of these demands consists in repressing the occurrence of a crystal defect in the substrates formed of semiconductor wafers in the process of manufacture of semiconductor devices.

As a technique for attaining this repression of crystal defect, the gettering method which comprises forming a distortion field outside the area for device formation in the process of fabrication of the device and causing heavy metals and other impurities being unintentionally introduced into this area to be collected in the distortion field has been known to the art. This gettering method comes under two major versions, intrinsic gettering (IG) and extrinsic gettering (EG).

The intrinsic gettering method has been proposed by Tan et al. of IBM. It is based on the principle of forming a defectless layer on the surface of a wafer and a layer of high defect concentration inside the wafer. Specifically, the method comprises subjecting the supersaturating oxygen being introduced into a Czochralski (CZ) crystal pulled up by the CZ technique to a heat treatment at a temperature in the neighborhood of 1,000° C. thereby inducing precipitation of the oxygen in the form of an oxide like cristobalite and utilizing this precipitate as a source layer for the generation of defects in a high concentration. This method is subdivided into three types by the combination of heat treatments performed at low temperatures in the range of from 650° C. to 800° C. and at high temperatures exceeding 1,000° C. Unlike the extrinsic gettering, the intrinsic gettering entails the difficulty in necessitating accurate control of oxygen concentrations and ensuring uniform distribution thereof in the bulk crystals not withstanding the advantage that the impurities to be introduced from the external sources are small in volume and that the effect of treatment is maintained until completion of the process.

The extrinsic gettering falls under a mechanical method and a physicochemical method. The mechanical method consists in inflicting a mechanical damage upon the rear surface of a wafer and heat-treating the wafer sustaining the damage thereby inducing a dislocation. The physicochemical method is further divided under two types, one resorting to diffusion of phosphorus and the other effecting the gettering by the implantation of ion in the rear surface of a wafer.

As the mechanical method, the practice of impinging quartz particles or alumina particles on the rear surface of a semiconductor wafer has been adopted heretofore. The lattice distortion which is consequently introduced into the rear surface of the semiconductor wafer is called a "backside damage," the extent of which constitutes itself an important factor for the gettering technique mentioned above.

The conventional method for the formation of such a backside damage as described above has entailed the problem that the impinged quartz particles or alumina particles are broken into smaller fragments and these fragments are suffered to persist as foreign matter on or in the semiconductor wafer under treatment and form a cause for rendering semiconductor devices such as LSI rejectable on account of defective quality in the process of fabrication. Moreover, the fragments of quartz or alumina contain in high concentration impurities different from the material of the semiconductor substrate and, therefore, form a cause for pollution of semiconductor devices in the process of fabrication, induce the occurrence of lattice defects in the semiconductor wafers, and rather degrade the yield of production than ensure the manifestation of the gettering effect and improve the yield of production.

For the solution of this problem, the method which comprises impinging ice particles against the rear surface of a semiconductor wafer has been proposed. By this method, however, the density of lattice defects to be introduced cannot be freely varied and controlled as desired because the ice particles have a fixed specific gravity and have their individual weights automatically determined by their own diameters and they have a fixed hardness. Particularly since the ice has a small specific gravity of 0.917 g/cm$^3$, the magnitude of dynamic energy which can be imparted to the ice particles has its own limit and, as a result, the extent of the damage which can be inflicted by the ice particles on the semiconductor wafer has its own limit.

SUMMARY OF THE INVENTION

This invention aims to solve the problems suffered by the prior art as described above. An object of this invention is to provide a method for the treatment of a semiconductor wafer, which is capable of freely varying and controlling the density of lattice defects introduced into the semiconductor wafer and, at the same time, raising the upper limit of the extent of backside damage while, in the formation of the backside damage, adhering to the aforementioned manner of infliction of the backside damage which entails the pollution only sparingly.

The object of this invention described above is accomplished by allowing free selection of the specific gravity and hardness of particles to be used for collision against the semiconductor wafer and facilitating the removal from the treated surface of the semiconductor wafer of the fragments of the material of the particles adhering to the surface of the semiconductor wafer in consequence of the collision.

To be specific, this invention is directed to a method for the treatment of a semiconductor wafer by the collision of particles against the semiconductor wafer for intentional impartation of a lattice distortion to the surface of the semiconductor wafer, which method is characterized by forming a substance possessing a melting point of not higher than 30° C. and exhibiting solubility in water into particles of a diameter in the range of from 0.001 to 1 mm and causing the particles to collide against the surface of the semiconductor wafer thereby effecting the impartation of a lattice distortion to the surface of the semiconductor wafer.

DETAILED DESCRIPTION OF THE PREFERRED EMBODIMENT

In this invention, as the material for forming the particles, a substance which possesses a melting point of not higher than 30° C. and exhibiting solubility in wafer is adopted.

It is essential in this invention that the semiconductor wafer should be washed after it has undergone the collision of the particles. The substance forming the particles, therefore, is required to be very easily dissolved in water or an aqueous solution being used for the washing at a temperature prescribed for the washing. The inventors have tried various substances as to their usability for the particles to find that inorganic substances do not suit the purpose of this invention because they entrain metallic impurities and these metallic impurities form a cause for pollution.

Since the substance forming the particles of this invention has a melting point of not higher than 30° C., even when the substance of the particles adheres to the surface of the semiconductor wafer after the particles have collided against the semiconductor wafer, the substance can be liquefied on the surface of the semiconductor wafer by simply elevating the temperature of the ambient air to a level exceeding the melting point of this substance. The substance is rendered readily removable from the surface of the semiconductor wafer by simply being liquefied as described above. Since the substance of the particles is soluble in water, the removal thereof from the semiconductor wafer can be attained more easily by washing with water or an aqueous solution. When the semiconductor wafer after the collision of the particles is given an RCA washing at a temperature of not lower than 80° C., therefore, the substance of the particles adhering to the surface thereof can be removed very easily.

As desirable examples of the organic substance which solidifies at a temperature below the room temperature and which exhibits solubility in water while in the process of washing immediately after the infliction of the aforementioned backside damage, acetoin, acetonitrile, acetone, acetone azine, 2-aminoethanol, ethanol, formic acid, acetic acid, diethanolamine, triethanolamine, triethylene glycol, 2,5-hexanedion, vinylacetic acid, methanol, and butyric acid may be cited.

In this invention, after the impartation of a lattice distortion to the surface of a semiconductor wafer by the collision of the particles against the semiconductor wafer, the semiconductor wafer is washed in water or an aqueous solution capable of dissolving the particles at a temperature in the range of from 50° C. to 100° C. to effect solution of the substance adhering to the semiconductor wafer. By this washing, the substance of the particles adhering fast to the surface of the semiconductor wafer in consequence of the collision of the particles against the semiconductor wafer can be thoroughly removed. At this time, the speed of cleaning of the semiconductor wafer can be increased and the thoroughness of cleaning can be enhanced by keeping the temperature of the wafer or aqueous solution in the range of from 50° C. to 100° C.

The water to be used for this washing must be highly pure and must not contain any components such as heavy metals which do not meet the object of this invention. As the aqueous solution, a mixture of aqua ammonia and hydrogen peroxide solution is used. It is as essential for this aqueous solution as for water that impurities like heavy metals should not be contained therein.

In this invention, for the fabrication of the particles to be used for collision against the semiconductor wafer, the methods which are disclosed in Japanese Unexamined Patent Publication (KOKAI) No. 226,632/1987 may be adopted, for example. One of the methods produces the particles by impinging one of the substances cited above as materials usable for the particles of this invention or a mixture of two or more such substances at the temperature of liquefied nitrogen thereby reducing the substance or mixture into minute particles. In this case, the mixture of two or more substances mentioned above may be in the form of an organic solution.

The collision of the particles against the semiconductor wafer is desired to be effected by means of a jet of gas. For the jet gas, the gas of an extremely low temperature which occurs when the liquefied gas being used for the formation of the particles is gasified is used. The particles are desired to be used for actual collision against the semiconductor wafer immediately after they have been produced. This practice can preclude the otherwise possible decrease in the proportion of the substance to be effectively used for the mechanical impact in consequence of liquefaction and vaporization.

The impartation of a lattice distortion to the surface of a semiconductor wafer is accomplished by forming a substance possessing a melting point of not higher than 30° C. and exhibiting solubility in water into particles of a diameter in the range of from 0.001 to 1 mm and causing the particles to collide against the surface of the semiconductor wafer. The specific gravity and hardness of the particles can be varied and, consequently, the energy of impact of the collision of the particles against the surface of the semiconductor wafer can be varied by varying the substance to be used for the formation of the particles. Thus, the density of lattice defects to be imparted to the surface of the semiconductor wafer can be freely varied and controlled as desired.

When the substance forming the particles happens to possess a melting point of not higher than 30° C. and exhibit solubility in water and, as a result, this substance adheres fast to the surface of the semiconductor wafer in consequence of the collision, it can be easily dissolved and removed by elevating the temperature of the ambient air and washing the defiled semiconductor wafer with water or the aqueous solution. Since the washing is made with water or aqueous solution, the frequency of washing can be decreased and the possibility of such impurities as heavy metals persisting on the washed surface can be precluded.

Now, this invention will be described specifically below with reference to a working example.

EXAMPLE

In the embodiment of this invention, minute particles of an organic substance were produced by following the method which is disclosed in Japanese Unexamined Patent Publication (KOKAI) No.226,632/1987. In the method so disclosed, an aqueous acetic acid solution is forced down with nitrogen gas through a mass of liquefied nitrogen stored in a closed container and then extruded through a nozzle. The mist of the aqueous acetic acid solution which emanated from the nozzle is instantaneously turned into minute particles of glacial acetic acid. The diameter of the minute particles thus formed can be freely controlled by adjusting the condition of extrusion of the solution and the retention time of the aqueous acetic acid solution in the mass of liquefied nitrogen. Precisely, this method produces the minute particles by spouting the organic substance at the temperature of liquefied nitrogen.

As indicated in the patent specification covering the method under discussion, particles measuring approximately between 0.07 and 0.08 mm in diameter were obtained in the present example. For comparison with the particles disclosed in Japanese Unexamined Patent Publication (KOKAI) No. 226,632/1987, the particles in the present example were prepared with varying materials and used for collision against a semiconductor wafer under entirely identical conditions. Specifically, by the use of a high-pressure ejector, the particles were hurled against the surface of a semiconductor wafer at a high pressure of 5 kg/c m$^2$ G as expelled with nitrogen gas supplied at a flow volume of 1 N liter/min. The semiconductor wafer thus exposed to the collision of the particles were immersed in a mixture of aqua ammonia and hydrogen peroxide solution kept at 85° C. and washed therein for 20 minutes.

A silicon wafer was used as the semiconductor wafer in the present example and, after exposure thereof to the collision of the particles mentioned above, was examined as to the extent of infliction of a lattice distortion thereon. To be more specific, the silicon wafer was heat-treated for two hours in an atmosphere of steam kept at a temperature of 1,100° C. and then cooled to room temperature. The cooled silicon wafer was treated with fluorine to remove the oxide film adhering to the surface thereof and then treated by the selective etching method to expose the lattice defects sustained therein and observed under an optical microscope to take count of the lattice defects and determine the density thereof.

Unlike the particles produced by the method taught in Japanese Unexamined Patent Publication (KOKAI) No. 226,632/1987, the particles produced in the present example revealed variation in the density of lattice defects introduced into the silicon wafer, depending on the kind of substance forming the particles. The results of this example using particles of acetic acid and those of ice for comparison show that the density of lattice defects was $10^4$/cm$^2$ in the case of acetic acid and that of lattice defects was $10^3$/cm$^2$ in the case of ice. This difference may be logically explained by a supposition that the particles of acetic acid inflicted greater damage because the specific gravity of acetic acid is 1.069 g/cm$^3$ compared with that of ice which is 0.917 g/cm$^3$.

When the experiment was repeated with such other materials of the particles as acetoin, acetone, acetonitrile, acetone azine, 2-minoethanol, ethanol, formic acid, diethanolamine, triethanolamine, triethtylene glycol, 2,5-hexanedione, vinylacetic acid, methanol, and butyric acid, the results were similar to those obtained in the present example. These substances are characterized by possessing a melting point of not higher than 30° C. and exhibiting solubility in water. When the particles made of these materials were impinged on a silicon wafer, the substances adhering to the silicon wafer were very easily dissolved and removed from the surface of silicon wafer by the washing of the semiconductor wafer with a mixture of aqua ammonia and hydrogen peroxide solution kept at 85° C. This fact characterizes these materials.

As is plain from the description made thus far, this invention represses the possible pollution of a semiconductor wafer with impurities during the implantation of a mechanical distortion by the collision of particles, permits effective removal of impurities suffered to adhere to the surface of the semiconductor wafer in consequence of the collision of the particles, and permits the density of lattice defects imparted to the semiconductor wafer to be varied and controlled freely as desired. Since this invention allows use of a substance having a greater specific gravity than water as the material for the particles to be used for the collision, the dynamic energy to be imparted to the particles can be increased, the energy of impact resulting from the collision can be proportionately augmented, and the extent of the damage consequently inflicted on the semiconductor wafer can be conspicuously enlarged in a heretofore unattainable measure.

What is claimed is:

1. A method for the treatment of a semiconductor wafer by the collision of particles against said semiconductor wafer for intentional impartation of a lattice distortion to the surface of said semiconductor wafer, which method is characterized by forming an organic substance possessing a melting point of not higher than 30° C. and exhibiting solubility in water into particles of a diameter in the range of from 0.001 to 1 mm and causing said particles to collide against the surface of said semiconductor wafer thereby effecting said impartation of a lattice distortion to the surface of said semiconductor wafer; and wherein said semiconductor wafer whose surface has sustained a lattice distortion in consequence of said collision of particles is washed in water or an aqueous solution capable of dissolving the substance forming said particles at a temperature in the range of from 50° to 100° C. thereby to obtain dissolution of said substance adhering to said semiconductor wafer.

2. A method according to claim 1, wherein said collision of particles against said semiconductor wafer is attained by the use of a jet of a gas adapted to hurl said particles against said semiconductor wafer.

3. A method for the treatment of a semiconductor wafer by the collision of particles against said semiconductor wafer for intentional impartation of a lattice distortion to the surface of said semiconductor wafer, which method is characterized by forming an organic substance possessing a melting point of not higher than 30° C. and exhibiting solubility in water into particles of a diameter in the range of from 0.001 to 1 mm and causing said particles to collide against the surface of said semiconductor wafer thereby effecting said impartation of a lattice distortion to the surface of said semiconductor wafer; and wherein material for said particles is selected from the group consisting of acetoin, acetonitrile, acetone, acetone azine, 2-aminoethanol, ethanol, formic acid, acetic acid, diethanolamine, triethanolamine, triethylene glycol, 2,5-hexanedione, vinylacetic acid, methanol, and butyric acid.

4. A method according to claim 3, wherein said semiconductor wafer whose surface has sustained a lattice distortion in consequence of said collision of particles is washed in water or an aqueous solution capable of dissolving an organic substance forming said particles at a temperature in the range of from 50° to 100° C. thereby to obtain dissolution of said substance adhering to said semiconductor wafer.

5. A method according to claim 3, wherein said collision of particles against said semiconductor wafer is attained by the use of a jet of gas adapted to hurl said particles against said semiconductor wafer.

6. A method according to claim 4, wherein said collision of particles against said semiconductor wafer is attained by the use of a jet of gas adapted to hurl said particles against said semiconductor wafer.

* * * * *